United States Patent
Sugimoto et al.

(10) Patent No.: US 9,826,643 B2
(45) Date of Patent: Nov. 21, 2017

(54) ENTRY SHEET FOR DRILLING AND DRILLING METHOD

(71) Applicant: Mitsubishi Gas Chemical Company, Inc., Tokyo (JP)

(72) Inventors: Noriaki Sugimoto, Yonezawa (JP); Katsutoshi Ihara, Yonezawa (JP); Takuya Hasaki, Yonezawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 125 days.

(21) Appl. No.: 14/387,206

(22) PCT Filed: Mar. 21, 2013

(86) PCT No.: PCT/JP2013/058076
§ 371 (c)(1),
(2) Date: Sep. 22, 2014

(87) PCT Pub. No.: WO2013/141299
PCT Pub. Date: Sep. 26, 2013

(65) Prior Publication Data
US 2015/0125228 A1 May 7, 2015

(30) Foreign Application Priority Data
Mar. 21, 2012 (JP) .................. 2012-063548

(51) Int. Cl.
*H05K 3/00* (2006.01)
*B26F 1/16* (2006.01)
*C10M 145/40* (2006.01)

(52) U.S. Cl.
CPC ............. *H05K 3/0047* (2013.01); *B26F 1/16* (2013.01); *C10M 145/40* (2013.01); *C10M 2209/1023* (2013.01); *C10M 2209/1033* (2013.01); *C10M 2209/12* (2013.01); *C10M 2209/123* (2013.01); *C10M 2217/0403* (2013.01); *C10N 2220/021* (2013.01); *C10N 2220/142* (2013.01); *C10N 2240/401* (2013.01); *C10N 2250/141* (2013.01); *H05K 2203/0214* (2013.01); *Y10T 408/03* (2015.01); *Y10T 428/266* (2015.01); *Y10T 428/269* (2015.01); *Y10T 428/31522* (2015.04); *Y10T 428/31605* (2015.04); *Y10T 428/31681* (2015.04); *Y10T 428/31692* (2015.04); *Y10T 428/31703* (2015.04)

(58) Field of Classification Search
CPC ............. H05K 3/0047; H05K 2203/0214; B26F 1/16; Y10T 408/03; Y10T 428/266; Y10T 428/31692; Y10T 428/31522; Y10T 428/31605; Y10T 428/31703; Y10T 428/269; Y10T 428/31681; C10M 145/40; C10M 2209/12; C10M 2209/123; C10M 2209/1033; C10M 2209/1023; C10N 2240/401; C10N 2220/021; C10N 2220/142; C10N 2250/141; C10N 2217/0403
See application file for complete search history.

(56) References Cited

U.S. PATENT DOCUMENTS

| | | | |
|---|---|---|---|
| 5,082,402 A | 1/1992 | Gaku et al. | |
| 2003/0100456 A1* | 5/2003 | Hasaki | B23B 35/005 508/517 |
| 2004/0209091 A1 | 10/2004 | Izumi et al. | |
| 2005/0003169 A1* | 1/2005 | Ikeguchi | B23B 35/00 428/195.1 |
| 2007/0281181 A1* | 12/2007 | Akita | H05K 3/0047 428/626 |
| 2010/0167041 A1 | 7/2010 | Matsuyama et al. | |
| 2010/0230382 A1 | 9/2010 | Narahashi et al. | |
| 2016/0045961 A1* | 2/2016 | Umehara | B23B 35/00 428/596 |

FOREIGN PATENT DOCUMENTS

| | | |
|---|---|---|
| JP | S63-277298 A | 11/1988 |
| JP | H04-92494 | 3/1992 |
| JP | H05-169400 | 7/1993 |
| JP | 3251082 B2 | 11/2001 |
| JP | 2003-26945 A | 1/2003 |

(Continued)

OTHER PUBLICATIONS

CP Kelco, Carboxymethylcellulose Book, 2009, p. 1-26.*
"Function & Application of Water Soluble Polymer" written by Teruo Horiuchi in Japanese.

(Continued)

*Primary Examiner* — Robert Jones, Jr.
(74) *Attorney, Agent, or Firm* — Fitch, Even, Tabin, & Flannery LLP

(57) ABSTRACT

Provided is an entry sheet for drilling that, compared with a conventional entry sheet for drilling, has better hole position accuracy, can suppress drill bit breakage, and exhibits less processing chips wrapping around the drill bit. This entry sheet for drilling includes a metallic support foil and a layer comprising a resin composition that is formed on at least one surface of the metallic support foil, wherein the resin composition contains a cellulose derivative (A) and a water-soluble resin (B), the cellulose derivative (A) includes a hydroxyalkyl cellulose and/or a carboxyalkyl cellulose having a weight average molecular weight of 20,000 to 350,000, and based on 100 parts by mass of the resin composition, the content of the cellulose derivative (A) is 5 to 40 parts by mass and the content of the water-soluble resin (B) is 60 to 95 parts by mass.

17 Claims, 1 Drawing Sheet

(56) References Cited

FOREIGN PATENT DOCUMENTS

| | | | |
|---|---|---|---|
| JP | 2003-94217 | A | 4/2003 |
| JP | 2003-94389 | A | 4/2003 |
| JP | 2003-136485 | A | 5/2003 |
| JP | 2003-225814 | A | 8/2003 |
| JP | 2003-301187 | A | 10/2003 |
| JP | 2004-230470 | A | 8/2004 |
| JP | 2009-18385 | A | 1/2009 |
| JP | 2009-172755 | A | 8/2009 |
| JP | 4732222 | B2 | 7/2011 |
| JP | 4782222 | B2 | 7/2011 |
| JP | 4798308 | B2 | 8/2011 |
| TW | 201043362 | A | 12/2010 |
| TW | 201100588 | A | 1/2011 |
| WO | 2009/151107 | A1 | 12/2009 |
| WO | 2010/140333 | A1 | 12/2010 |

OTHER PUBLICATIONS

International Search Report for PCT/JP2013/058076 dated Jun. 18, 2013 and English translation of the same. (3 pages).

* cited by examiner

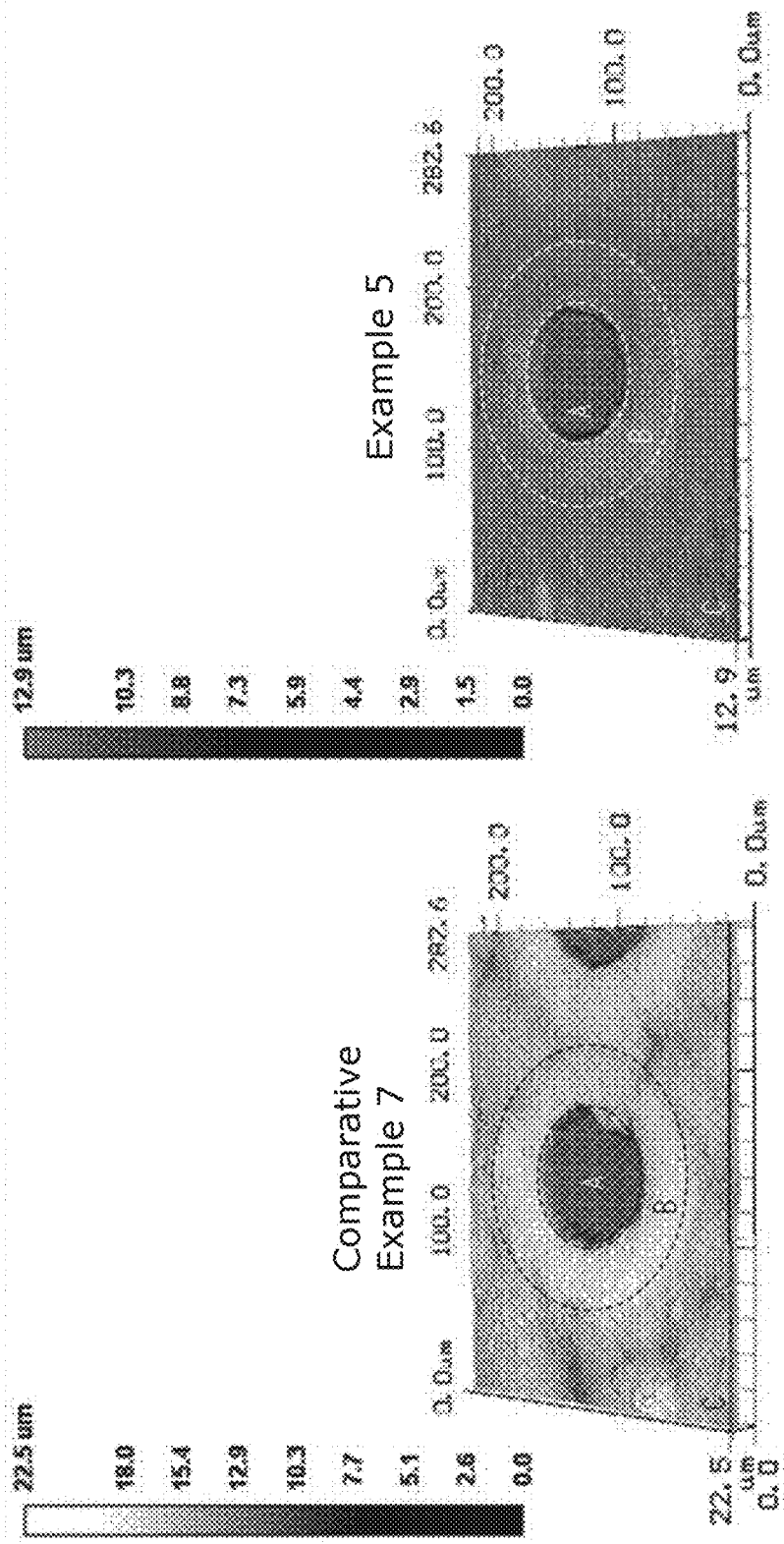

ENTRY SHEET FOR DRILLING AND DRILLING METHOD

CROSS-REFERENCE TO RELATED APPLICATIONS

This application is a U.S. national phase application filed under 35 U.S.C. §371 of International Application PCT/JP2013/058076, filed on Mar. 21, 2013, designating the United States, which claims priority from Japanese Application Number 2012-063548, filed Mar. 21, 2012, which are hereby incorporated herein by reference in their entirety.

TECHNICAL FIELD

The present invention relates to an entry sheet for drilling and a drilling method.

BACKGROUND ART

As a method of drilling processing of a laminated board or a multi-layer board that is used in a printed wiring board, a method involving conducting hole boring processing by placing, as an entry board, metal foil of aluminum or the like used alone or a sheet obtained by forming a resin composition layer on a surface of the metal foil (hereinafter, the sheet is usually referred to as "entry sheet for drilling", or also simply referred to as "entry sheet") on the top of one laminated board or multi-layered board or a plurality of laminated boards or multi-layered boards piled has generally been adopted laminated board. Although commonly a copper clad laminated board is often used as the laminated board, the laminated board may be a "laminated board" that does not have a copper foil on an outer layer. In the present specification, unless stated otherwise, the laminated board refers to a copper-clad laminated board and/or a "laminated board" that does not have a copper foil on an outer layer.

Recently, with the demand for improved reliability of printed wiring boards and the progress made in increasing printed wiring board density, there is a need for high-quality drilling processing of laminated boards or multi-layer boards that, for example, improves hole position accuracy and reduces hole wall roughness. To respond to these needs, a hole boring processing method that uses a sheet of a water-soluble resin such as polyethylene glycol (e.g., refer to Japanese Patent Application Laid-Open No. 4-92494), a lubricant sheet for drilling in which a water-soluble resin layer is formed on a metallic support foil (e.g., refer to Japanese Patent Application Laid-Open No. 5-169400), an entry sheet for drilling in which a water-soluble resin layer is formed on aluminum foil formed with a thermosetting resin thin film (e.g., refer to Japanese Patent Application Laid-Open No. 2003-136485), a lubricant sheet for drilling obtained by blending a non-halogen colorant in a lubrication resin composition (e.g., refer to Japanese Patent Application Laid-Open No. 2004-230470) and the like have been proposed and put to practical use.

Further, with lasting progress toward higher-density printed wiring boards, the recent trend in drilling processing of laminated boards or multi-layer boards has the following characteristics. Namely, firstly, the interval between the drilling processed holes is becoming much narrower due to the increasing density of wiring circuits. Accordingly, to maintain insulating properties between the drilling processed holes, much superior hole position accuracy is required. Secondly, since the diameter of the drilling processed holes is becoming smaller and the strength of the smaller-diameter drill bits that are used lowers, drill bit breakage during drilling processing is becoming a problem. Namely, much better resistance to drill bit breakage is required.

To respond to these needs, it has been proposed to control the number average molecular weight of the polyethylene glycol and polyethylene oxide used as a resin composition for the entry sheet (e.g., refer to International Publication No. WO 2009151107). On the other hand, an attempt has also been made to improve resistance to drill bit breakage by providing a carbon-based coating on the tools (e.g., refer to Japanese Patent No. 4782222).

SUMMARY OF INVENTION

However, in the technology of International Publication No. WO 2009151107, there is room for further improvement in hole position accuracy and resistance to drill bit breakage to handle even further decreases in the diameter of drill bits.

In addition, since the resin composition layer of the entry sheet for drilling melts due to the heat of friction during drilling processing, an annular protrusion (a so-called doughnut shape) is produced around the periphery of the drilling processed hole due to the resin composition solidifying. Consequently, during narrow-pitch drilling processing, hole position accuracy deteriorates due to this protrusion, causing a new problem.

Further, even for a carbon-coated drill bit like that described in Japanese Patent No. 4782222, to obtain sufficient hole position accuracy, for example, an entry sheet for drilling that has a water-soluble resin layer on the above-described aluminum foil is required. However, when a carbon-coated drill bit is used with an entry sheet for drilling formed with a water-soluble resin layer, processing chips tends to wrap around the drill bit. If this processing chips wrapping is severe, new problems arise, such as hole position accuracy deterioration and the drill bit breakage.

In view of the above, there is a need for development of an entry sheet for drilling that has excellent hole position accuracy, can suppress drill bit breakage, and exhibits little processing chips wrapping around the drill bit.

It is an object of the present invention to provide an entry sheet for drilling that, as compared with a conventional entry sheet for drilling, has better hole position accuracy, can suppress drill bit breakage, and exhibits less processing chips wrapping around the drill bit, and a method for drilling using this entry sheet for drilling.

As a result of various diligent investigations to solve the above-described problems, the present inventors discovered that by using an entry sheet for drilling that has a layer comprising a resin composition (hereinafter also referred to simply as "resin composition layer") on at least one surface of a metallic support foil, in which the resin composition includes a specific hydroxyalkyl cellulose and/or carboxyalkyl cellulose, excellent centrality of a drill bit can be obtained while simultaneously suppressing drill bit breakage, thereby enabling hole position accuracy to be increased and processing chips wrapping around the drill bit to be suppressed, and completing the present invention.

The "centrality" refers to the ability to advance directly in the machining direction of the drill bit during machining. The higher the centrality, the less susceptible the drill bit is to slipping in the planar direction on the resin composition layer surface, and the more easily the drill bit advances in the thickness direction (drill bit machining direction) of the resin composition layer, so that consequently hole position accuracy improves. For example, at the point where the drill bit contacts the resin composition layer of the entry sheet, the cutting blade at the tip of the rotating drill bit bites the resin composition layer surface while slipping around. Simply increasing lubricating properties will just mean that it is easier for the drill bit to slip at the resin composition layer surface, so that centrality will be harmed, and consequently, hole position accuracy will deteriorate.

In the present invention, hydroxyethyl cellulose and/or carboxymethyl cellulose are blended in the resin composition. Hydroxyethyl cellulose and carboxymethyl cellulose are cellulose derivatives. Cellulose derivatives are used in products over a wide range of industrial fields, such as pharmaceuticals, foods, cosmetics, paints, and water-treatment chemicals (e.g., refer to Supervisory Editor Teruo Horiuchi, Functions and Applications of Water-Soluble Polymers, CMC Publishing, May 31, 2000, p. 1-17). In addition, in the machine processing field, cellulose derivatives may be used as adhesives in water-soluble lubricants, in which they have the effect of allowing the lubricant to uniformly adhere during plastic working of a metal (e.g., refer to Japanese Patent Application Laid-Open No. 63-277298). Among such processing, in aluminum plate molding, there are examples of using a lubricant coating that includes a cellulose derivative, which has the effect of improving the moldability of the aluminum plate itself (e.g., refer to Japanese Patent No. 3251082).

However, in the field relating to entry sheets for drilling used in drilling processing of a laminated board or a multi-layer board, which is the technical field of the present invention, although there is Document that mentions cellulose derivatives (e.g., refer to Japanese Patent Application Laid-Open No. 2003-94217, Japanese Patent Application Laid-Open No. 2003-094389, Japanese Patent Application Laid-Open No. 2003-225814, and Japanese Patent Application Laid-Open No. 2003-301187), there are no examples in which a cellulose derivative is actually used.

The present invention is as follows.

[1] An entry sheet for drilling comprising a metallic support foil and a layer comprising a resin composition that is formed on at least one surface of the metallic support foil, wherein the resin composition contains a cellulose derivative (A) and a water-soluble resin (B), the cellulose derivative (A) comprises a hydroxyalkyl cellulose and/or a carboxyalkyl cellulose having a weight average molecular weight of 20,000 to 350,000, and the content of the cellulose derivative (A) is 5 to 40 parts by mass and the content of the water-soluble resin (B) is 60 to 95 parts by mass based on 100 parts by mass of the resin composition.

[2] The entry sheet for drilling of the above [1], wherein the cellulose derivative (A) has a viscosity at 25° C. of a 2% by mass aqueous solution of 2 mPa·s or more to 300 mPa·s or less.

[3] The entry sheet for drilling of the above [1] or [2], wherein the cellulose derivative (A) has an average substitution degree of 0.5 to 3.0.

[4] The entry sheet for drilling of any one of the above [1] to [3], wherein the cellulose derivative (A) is hydroxyethyl cellulose and/or carboxymethyl cellulose.

[5] The entry sheet for drilling of any one of the above [1] to [4], wherein the cellulose derivative (A) comprises the hydroxyalkyl cellulose.

[6] The entry sheet for drilling of any one of the above [1] to [5], wherein the water-soluble resin (B) comprises one or more resins selected from the group consisting of polyalkylene oxides, polyalkylene glycols, polyalkylene glycol derivatives, water-soluble acrylic resins, water-soluble polyester resins, and water-soluble urethane resins.

[7] The entry sheet for drilling of any one of the above [1] to [6], wherein the water-soluble resin (B) has a weight average molecular weight of 3,000 to 150,000.

[8] The entry sheet for drilling of any one of the above [1] to [7], wherein the water-soluble resin (B) comprises a water-soluble resin (B-1) having a weight average molecular weight of more than 10,000 and a water-soluble resin (B-2) having a weight average molecular weight of 10,000 or less.

[9] The entry sheet for drilling of the above [8], wherein the water-soluble resin (B) comprises 5 to 50 parts by mass of the water-soluble resin (B-1) and 50 to 95 parts by mass of the water-soluble resin (B-2) based on 100 parts by mass of the water-soluble resin (B).

[10] The entry sheet for drilling of any one of the above [1] to [9], wherein the layer comprising a resin composition is formed by applying a solution containing the resin composition and water or a mixed solvent including water and alcohol on the at least one surface of the metallic support foil, drying, and solidifying.

[11] The entry sheet for drilling of any one of the above [1] to [10], wherein the layer comprising a resin composition has a thickness of 0.005 to 0.3 mm.

[12] The entry sheet for drilling of any one of the above [1] to [11], further comprising a resin coating between the metallic support foil and the layer comprising a resin composition.

[13] The entry sheet for drilling of the above [12], wherein the resin included in the resin coating comprises one or more resins selected from the group consisting of cyanate resins, epoxy resins, and polyester resins.

[14] The entry sheet for drilling of the above [12] or [13], wherein the resin coating has a thickness of 0.001 to 0.02 mm.

[15] The entry sheet for drilling of any one of the above [1] to [14], wherein the metallic support foil has a thickness of 0.05 to 0.5 mm.

[16] The entry sheet for drilling of any one of the above [1] to [15], wherein the metallic support foil is an aluminum foil having an aluminum purity of 95% or more.

[17] The entry sheet for drilling of any one of the above [1] to [16], which is used for drilling processing of a laminated board or a multi-layer board.

[18] The entry sheet for drilling of the above [17], which is used in hole boring processing by a drill bit having a diameter of 0.05 to 0.11 mmφ.

[19] A method for drilling, comprising placing the entry sheet for drilling of any one of the above [1] to [18] on a top surface of a laminated board or a multi-layer board, and drilling a hole in the laminated board or the multi-layer board from an upper surface of the entry sheet for drilling.

According to the present invention, an entry sheet for drilling that has better hole position accuracy, can suppress drill bit breakage, and exhibits less processing chips wrapping around the drill bit as compared with a conventional entry sheet for drilling, and a method for drilling using this entry sheet for drilling can be provided.

BRIEF DESCRIPTION OF DRAWINGS

FIG. 1 is a series of photographs illustrating a resin protrusion around the periphery of a drilling processed hole.

DESCRIPTION OF EMBODIMENTS

An embodiment for carrying out the present invention (hereinafter simply referred to as the "present embodiment") will now be described in detail with reference to the drawing as necessary. However, the present invention is not limited to the following present embodiment. Various modifications may be made to the present invention so long as such modifications do not depart from the gist of the invention.

An entry sheet for drilling according to the present embodiment includes a metallic support foil and a layer including a resin composition that is formed on at least one surface of the metallic support foil. The resin composition contains a cellulose derivative (A) and a water-soluble resin (B). The cellulose derivative (A) include a hydroxyalkyl cellulose and/or a carboxyalkyl cellulose having a weight average molecular weight of 20,000 to 350,000. Based on 100 parts by mass of the resin composition, the content of the cellulose derivative (A) is 5 to 40 parts by mass and the content of the water-soluble resin (B) is 60 to 95 parts by mass.

The cellulose derivative (A) according to the present embodiment includes a hydroxyalkyl cellulose and/or a carboxyalkyl cellulose. The hydroxyalkyl cellulose that can be included in the cellulose derivative (A) is a compound in which at least a part of the hydrogen atoms of the hydroxyl groups included in the cellulose represented by the following formula (1):

$$H\text{—}(C_6H_{10}O_5)_n\text{—}OH \quad (1)$$

is substituted with a monovalent group represented by the following formula (2):

$$\text{—}(R^1\text{—}O)_m\text{—}H \quad (2)$$

(in the above formulae (1) and (2), n and m each independently represent an integer of 1 or more; hereinafter the same). Although the solubility of the hydroxyalkyl cellulose in water is not especially limited, it is preferably at least 0.05 g/L at 25° C. and 1 atmosphere. The hydroxyalkyl cellulose can be synthesized by an ordinary method. For example, the hydroxyalkyl cellulose can be obtained by adding an alkylene oxide, such as ethylene oxide, to cellulose. Further, a commercially-available product can be used for the hydroxyalkyl cellulose. In the above formula (2), $R^1$ represents an alkylene group. From the perspective of more effectively and reliably achieving the objects of the present invention, the number of carbon atoms of the alkylene group is preferably 1 to 3, and more preferably 2 to 3. Further, from the same perspective, it is especially preferred that the hydroxyalkyl cellulose be hydroxyethyl cellulose.

The carboxyalkyl cellulose that can be included in the cellulose derivative (A) is a compound in which at least a part of the hydrogen atoms of the hydroxyl groups included in the cellulose represented by the above formula (1) is substituted with a monovalent group (a carboxyalkyl group) represented by the following formula (3):

$$\text{—}R^2\text{—}COOH \quad (3)$$

Although the solubility of the carboxyalkyl cellulose in water is not especially limited, it is preferably at least 0.05 g/L at 25° C. and 1 atmosphere. Further, a part of the carboxy groups in the carboxyalkyl group may be a sodium salt. The carboxyalkyl cellulose can be synthesized by an ordinary method. For example, the carboxyalkyl cellulose can be obtained by adding a carboxylate salt of chloroacetic acid or the like to cellulose. Further, a commercially-available product can be used for the carboxyalkyl cellulose. In the above formula (3), $R^2$ represents an alkylene group. From the perspective of more effectively and reliably achieving the objects of the present invention, the number of carbon atoms of the alkylene group is preferably 1 to 3, and more preferably 1 to 2. Further, from the same perspective, it is especially preferred that the carboxyalkyl cellulose be carboxymethyl cellulose.

The "cellulose" used in the present embodiment refers to a polymer compound in which many β-glucoses are linked together by glycosidic linkages, and the hydroxyl group linked to the carbon atom at the 2-, 3-, and 6-positions of the glucose ring of cellulose is unsubstituted. Further, "hydroxyl group included in cellulose" refers to a hydroxyl group that is linked to the carbon atom at the 2-, 3-, and 6-positions of a cellulose glucose ring.

Although the weight average molecular weight of the hydroxyalkyl cellulose or carboxyalkyl cellulose used in the present embodiment is not especially limited, a range of 20,000 to 350,000 is preferred, a range of 50,000 to 350,000 is more preferred, and a range of 100,000 to 300,000 is even more preferred. If the weight average molecular weight is 20,000 or more, hole position accuracy is even better. Further, if the weight average molecular weight is 350,000 or less, the entry sheet can have much better lubricating properties, and as a result, resistance to drill bit breakage can be further improved. The weight average molecular weight of the hydroxyethyl cellulose or carboxymethyl cellulose can be measured by an ordinary method using a GPC column and with polyethylene glycol as a standard substance.

Although the viscosity at 25° C. of a 2% by mass aqueous solution of the hydroxyalkyl cellulose or carboxyalkyl cellulose used in the present embodiment is not especially limited, a range of 2 to 300 mPa·s is preferred, a range of 5 to 200 mPa·s is more preferred, and a range of 10 to 150 mPa·s is even more preferred. If this viscosity is 2 mPa·s or more, hole position accuracy is even better. Further, if this viscosity is 300 mPa·s or less, the entry sheet can have much better lubricating properties, and resistance to drill bit breakage is further improved. The viscosity is a value obtained by measuring a 2% by mass aqueous solution for 60 seconds under a condition of 25° C. using a B II type viscometer (BL II) manufactured by Toki Sangyo Co., Ltd., based on JIS K7117 (1999). The viscosity is written below as "2% aqueous solution viscosity".

In the hydroxyalkyl cellulose used in the present embodiment, although the average number of added moles of alkylene oxide that are linked per glucose unit (hereinafter sometimes abbreviated as "MS") is not especially limited, a range of 0.5 to 4.0 is preferred, a range of 1.0 to 3.5 is more preferred, and a range of 1.5 to 2.5 is even more preferred. It is preferred that MS be 0.5 or more, because better water solubility can be obtained. It is preferred that MS be 4.0 or less from an economic perspective. Further, the average number of added moles of alkylene oxide that are linked per glucose unit can be measured based on the method described in ASTM D2364 (2007).

In the hydroxyalkyl cellulose or carboxyalkyl cellulose used in the present embodiment, although the average substitution degree (hereinafter sometimes abbreviated as "DS") is not especially limited, a range of 0.5 to 3.0 is preferred, a range of 0.6 to 2.5 is more preferred, and a range of 0.7 to 2.0 is even more preferred. It is preferred that DS be 0.5 or more, because better water solubility can be obtained. Further, DS cannot theoretically exceed 3.0. Here, "average substitution degree" refers to, in the hydroxyalkyl cellulose or carboxyalkyl cellulose, the average number of hydrogen atoms of the hydroxyl group at the 2-, 3-, and 6-positions per glucose unit that have been substituted with the above monovalent group represented by formula (2) or a carboxyalkyl group. In the case of a hydroxyalkyl cellulose such as hydroxyethyl cellulose, the average substitution degree can be measured by $^{13}$C-NMR based on the MS, and in the case of a carboxyalkyl cellulose such as carboxymethyl cellulose, the average substitution degree can be measured by $^{1}$H-NMR.

In the present embodiment, although one hydroxyalkyl cellulose and carboxyalkyl cellulose can be used alone, two or more of these may also be used in combination. The content of the cellulose derivative (A) in the resin composition is, based on 100 parts by mass of the resin composition, 5 to 40 parts by mass, preferably 10 to 30 parts by mass, more preferably 20 to 30 parts by mass, and even more preferably 25 to 30 parts by mass. By adjusting the content of the cellulose derivative (A) to 5 parts by mass or more, hole position accuracy becomes better. By adjusting the content of the cellulose derivative (A) to 40 parts by mass or less, the entry sheet can have much better lubricating properties, and as a result, resistance to drill bit breakage is further improved.

In the present embodiment, from the perspective of more effectively and reliably achieving the objects of the present invention, of hydroxyalkyl cellulose and carboxyalkyl cellulose, hydroxyalkyl cellulose is preferred.

In the present embodiment, as the resin included in the resin composition layer of the entry sheet for drilling, a preferably-used water-soluble resin (B) is a polymer compound, 1 g or more of that dissolve at 25° C. and 1 atmosphere based on 100 g of water. The water-soluble resin (B) is not especially limited as long as it is such a polymer compound. Examples of the water-soluble resin (B) include polyalkylene oxides such as polyethylene oxide, polypropylene oxide, and copolymers thereof; water-soluble urethane resin; water-soluble polyether resins; water-soluble polyester resins; water-soluble acrylic resins; sodium polyacrylate; polyacrylamide; polyvinylpyrrolidone; polyvinyl alcohol; polyalkylene glycols such as polyethylene glycol, polypropylene glycol, and copolymers thereof; polyalkylene glycol derivatives such as esters of polyalkylene glycol and ethers of polyalkylene glycol; and polyglycerin monostearate and derivatives thereof. These can be used alone or in combination of two or more thereof. Among these, from the perspective of more effectively and reliably achieving the objects of the present invention, it is preferred that the water-soluble resin (B) include one or more resins selected from the group consisting of polyalkylene oxides, polyalkylene glycols, polyalkylene glycol derivatives, water-soluble acrylic resins, water-soluble polyester resins, and water-soluble urethane resins. It is more preferred to include one or more resins selected from the group consisting of polyalkylene oxides, water-soluble polyether resins, and polyalkylene glycols. Further, from the same perspective, it is preferred that the polyalkylene oxide be polyethylene oxide, and that the polyalkylene glycol be polyethylene glycol. The water-soluble resin (B) may be produced by an ordinary method, or may be commercially available.

In the present embodiment, the weight average molecular weight of the water-soluble resin (B) is preferably 3,000 to 150,000. By adjusting the weight average molecular weight of the water-soluble resin (B) to 3,000 or more, the sheet forming properties of the entry sheet can be further improved. By adjusting the weight average molecular weight of the water-soluble resin (B) to 150,000 or less, hole position accuracy improves and resin winding around the drill bit can be further suppressed. The weight average molecular weight of the water-soluble resin (B) can be measured by an ordinary method using a GPC column and with polyethylene glycol as a standard substance.

In the present embodiment, as the water-soluble resin (B), it is preferred to combine two or more resins having different weight average molecular weights to be used. More specifically, it is more preferred that the water-soluble resin (B) include a water-soluble resin (B-1) having a weight average molecular weight of more than 10,000 and a water-soluble resin (B-2) having a weight average molecular weight of 10,000 or less. By combining such a water-soluble resin (B-1) and a water-soluble resin (B-2) as the water-soluble resin (B), the balance among sheet forming properties during production of the entry sheet, hole position accuracy, which is a characteristic of the entry sheet for drilling, resin winding around the drill bit and the like can be further improved. For example, by using the water-soluble resin (B-1) that has a weight average molecular weight of more than 10,000, since the sheet forming properties of the entry sheet are further improved, deterioration in hole position accuracy, drill breakage and the like can be suppressed. On the other hand, by using the water-soluble resin (B-2) that has a weight average molecular weight of 10,000 or less, the melt viscosity of the resin composition can be prevented from becoming too high, and as a result, deterioration in hole position accuracy and an increase in resin winding around the drill bit can be more effectively and reliably prevented. From these perspectives, it is preferred to combine and use two or more resins having different weight average molecular weights as the water-soluble resin (B). The weight average molecular weight of the water-soluble resin (B-1) is more preferably 15,000 or more, and especially preferably 18,000 or more; and more preferably 150,000 or less, and especially preferably 100,000 or less. Further, the weight average molecular weight of the water-soluble resin (B-2) is more preferably 2,000 or more, and especially preferably 3,000 or more; and more preferably 9,000 or less, and especially preferably 8,000 or less.

In the present embodiment, if the water-soluble resin (B) includes the above-described water-soluble resin (B-1) and water-soluble resin (B-2), based on 100 parts by mass of the water-soluble resin (B), the content of the water-soluble resin (B-1) is preferably 5 to 50 parts by mass, more preferably 5 to 40 parts by mass, and even more preferably 10 to 30 parts by mass. Further, based on 100 parts by mass of the water-soluble resin (B), the content of the water-soluble resin (B-2) is preferably 50 to 95 parts by mass, more preferably 60 to 95 parts by mass, and especially preferably 70 to 90 parts by mass. As described above, by adjusting the content of the water-soluble resin (B-1) to 50 parts by mass or less and the content of the water-soluble resin (B-2) to 50 parts by mass or more, an increase in the melt viscosity of the resin composition can be suppressed. Consequently, deterioration in hole position accuracy and an increase in resin winding around the drill bit can be prevented more effectively and reliably. On the other hand, by adjusting the content of the water-soluble resin (B-1) to 5 parts by mass or more and the content of the water-soluble resin (B-2) to 95 parts by mass or less, the sheet forming properties of the entry sheet are further improved, and as a result, deterioration in hole position accuracy, drill breakage and the like can be suppressed.

The resin composition used in the present embodiment may optionally further contain various additives. Examples of such additives may include, but are not especially limited to, a surface control agent, a leveling agent, an antistatic agent, an emulsifier, a defoamer, a wax additive, a coupling agent, a rheology control agent, an antiseptic, a fungicide, an antioxidant, a light stabilizer, a nucleating agent, an organic filler, an inorganic filler, a solid lubricant, a thermal stabilizer, and a colorant. These can be used alone or in combination of two or more thereof.

Among these, it is preferred that the resin composition contain a surface control agent, because the hole position accuracy of the entry sheet is further improved. Examples of the surface control agent may include, but are not especially limited to, nonionic surfactants, anionic surfactants, cationic surfactants, and amphoteric surfactants. More specifically, examples include silicon surfactants, sorbitan aliphatic acid ester surfactants, and acrylic surfactants. Examples of a commercially-available product may include the silicon surfactants BYK-349 (manufactured by BYK Japan KK) and BYK-014 (manufactured by BYK Japan KK). These can be used alone or in combination of two or more thereof. Although the content of the surface control agent is not especially limited, based on 100% by mass of the resin composition, 0.1 to 10% by mass is preferred, and 0.3 to 5% by mass is more preferred.

In the present embodiment, examples of the method for forming the resin composition layer on at least one surface of the metallic support foil may include a method that includes applying a solution obtained by appropriately melting the resin composition, or a solution obtained by dissolving or dispersing the resin composition in a solvent (hereinafter simply referred to as "resin composition solution") on at least one surface of the metallic support foil, then drying, cooling, and solidifying the coating liquid to form a resin composition layer (coating method), and a method that includes forming a resin composition layer in advance, then laminating the resin composition layer on at least one surface of the metallic support foil, and pasting by heating with a roll and the like or using an adhesive and the like. In the pasting method, the method for producing the resin composition layer is not especially limited, as long as it is a known method that is employed industrially. Specific examples may include a method that includes forming the resin composition layer on a release film by a roll method or a curtain coating method in which the resin composition is mixed by appropriately heating and melting using a roll, a kneader, or other kneading means, and a method that includes forming the resin composition into a resin composition sheet with a desired thickness in advance using a roll, a T-die extruder or the like. Further, although described in more detail below, in terms of laminating and integrating the metallic support foil and the resin composition layer, it is preferred that a resin coating be formed in advance on one surface forming the resin composition layer of the metallic support foil forming the resin composition layer.

If employing a method such as a coating method, in which a resin composition solution is directly applied on the metallic support foil, then dried, cooled, and solidified, the used solvent is preferably water, or a mixed solvent of water and an organic solvent. From the perspective of antiseptic properties and fungicidal properties, the perspective of improving wettability to the substrate, the perspective of improving filtering efficiency and bubble releasability by reducing the viscosity of the resin composition solution, and the perspective of improving defoaming properties by decreasing polarity, the solvent is preferably a mixed solvent of and one or more organic solvent selected from the group consisting of alcohols such as ethanol, methanol and isopropyl alcohol, methyl ethyl ketone, and acetone. The solvent is more preferably a mixed solved of methanol and water. The ratio of the water and the organic solvent in the mixed solvent of water and an organic solvent may be appropriately selected, as this ratio affects solubility.

When using a resin composition solution, although the mass percentage concentration of the resin solid content in the solution based on 100% by mass of the solution (hereinafter simply referred to as "resin solid concentration") is not especially limited, 10 to 60% by mass is preferred, 15 to 50% by mass is more preferred, and 20 to 40% by mass is even more preferred. If the resin solid concentration is 10% by mass or more, entry sheet productivity increases. If the resin solid concentration is 60% by mass or less, the viscosity of the resin composition solution is less susceptible to increasing, and control of the thickness, smoothness and the like of the resin composition layer during coating becomes even easier. Consequently, the surface state of the resin composition layer can be prevented from becoming rough, so that a resin composition layer having a smoother surface is obtained. As a result, even better hole position accuracy during drilling processing is obtained.

Further, before applying the resin composition solution on at least one surface of the metallic support foil, from the perspective of preventing the entry of contaminants, the resin composition solution can be filtered as a pre-treatment. Although the employed filtering method and filtering material are not especially limited, it is preferred to employ a filtering method and filtering material in which the filtering accuracy is less than 50 μm, more preferred to employ a filtering method and filtering material in which the filtering accuracy is less than 25 μm, and even more preferred to employ a filtering method and filtering material in which the filtering accuracy is less than 10 μm. Adjusting the filtering accuracy at less than 50 μm enables the entry of contaminants into the resin composition layer to be more effectively and reliably prevented, and the hole position accuracy to be further increased. Further, since the filtering accuracy also affects costs and productivity, it may be appropriately selected in consideration of these factors as well.

The metallic support foil included in the entry sheet for drilling according to the present embodiment preferably has a thickness of 0.05 to 0.5 mm, and more preferably a thickness of 0.05 to 0.3 mm. If the thickness of the metallic support foil is 0.05 mm or more, the occurrence of burrs on the laminated board during drilling processing can be further suppressed. On the other hand, if the thickness is 0.5 mm or less, it is even easier to discharge the processing chips that are produced during drilling processing. Further, as the type of metal for the metallic support foil, from the perspectives of availability, cost and processability, aluminum is preferable. The quality of this aluminum foil is preferably such that an aluminum purity is 95% or more. Specific examples of such aluminum foil include 5052, 3004, 3003, 1N30, 1N99, 1050, 1070, 1085, 1100, and 8021 defined in JIS H4160 (2006). Using aluminum foil having an aluminum purity of 95% or more for the metallic support foil enables the impact of the drill bit to be reduced, the drill bit biting properties to be improved, and the hole position accuracy of the drilling processed holes to be further improved.

Further, using the metallic support foil with a resin coating pre-formed thereon is preferred from the perspective of enabling adhesion with the resin composition layer to be further improved. Namely, it is preferred that the entry sheet according to the present embodiment include a resin coating between the metallic support foil and the resin composition layer. From the perspectives of cost and drilling properties, the resin coating preferably has a thickness of 0.001 to 0.02 mm, and more preferably a thickness of 0.005 to 0.015 mm. The resin included in the resin coating is not especially limited, and may be either a thermoplastic resin or a thermosetting resin, or may be even a combination of these.

Examples of thermoplastic resins include urethane-based polymers, acrylic polymers, vinyl acetate polymers, vinyl chloride polymers, polyester-based polymers, and copolymers thereof. Further, examples of thermosetting resins include phenol resins, epoxy resins, melamine resins, urea resins, unsaturated polyester resins, alkyd resins, polyurethanes, thermosetting polyimide, and cyanate resins. Among these, from the perspectives of adhesion and drilling properties, preferred examples include epoxy resins and polyester resins (polyester-based polymers, polyester-based copolymers, and unsaturated polyester resins). In addition, a foil obtained by coating with the resin coating in advance by a known method on a commercially-available metal foil can also be used as the metallic support foil used in the present embodiment.

It is preferred to use the entry sheet for drilling according to the present embodiment for drilling processing in a laminated board or a multi-layer board, because the objects of the present invention can be achieved more effectively and reliably. Further, if that drilling processing is carried out using a drill bit with a diameter of 0.05 mmϕ or more to 0.3 mmϕ or less, the objects of the present invention can be achieved even more effectively and reliably. The entry sheet for drilling according to the present embodiment is suitable for small diameter drill bit applications with a diameter of 0.05 mmϕ or more to 0.15 mmϕ or less, particularly suitable for very small diameter drill bit applications with a diameter of 0.05 mmϕ or more to 0.105 mmϕ or less, for which hole position accuracy is important, because drill bit breakages can be remarkably reduced. In addition, the entry sheet according to the present embodiment is suitable even in drilling processing that uses a carbon-coated drill bit, because processing chips wrapping around the drill bit is reduced. Here, a drill bit diameter of 0.05 mmϕ is the lower limit of a diameter of commercially-available drill bits. If drill bits having a smaller diameter than this become available, the above-described lower limit will change accordingly. Further, there is no problem in employing the entry sheet according to the present embodiment in drilling processing that uses a drill bit having a diameter of more than 0.3 mmϕ.

The thickness of the resin composition layer in the entry sheet for drilling according to the present embodiment differs depending on the diameter of the drill bit used during drilling processing, the structure of the laminated board or multi-layer board and the like, but is preferably in the range of 0.005 to 0.3 mm, more preferably in the range of 0.01 to 0.2 mm, and even more preferably in the range of 0.02 to 0.12 mm. By adjusting the thickness of the resin composition layer to 0.005 mm or more, an even more sufficient lubricating effect is obtained, and deterioration in hole wall roughness can be suppressed. Further, since the load on the drill bit is reduced, drill bit breakage can be prevented even more effectively. On the other hand, by adjusting the thickness of the resin composition layer to 0.3 mm or less, processing chips wrapping around the drill bit can be reduced even more.

The thickness of the respective layers forming the entry sheet for drilling is measured as follows. Namely, using a cross section polisher (trade name "Cross-Section Polisher SM-09010", manufactured by JEOL, Ltd.), or an ultramicrotome (trade name "EM UC7", manufactured by Leica), the entry sheet for drilling is cut in the lamination direction of each of the layers from the surface on the resin composition layer side of the entry sheet for drilling. Then, using an SEM (scanning electron microscope, model "VE-7800", manufactured by Keyence Corporation), the cross-section appeared by cutting is observed from the vertical direction with respect to the cross-section, and the thicknesses of the metal foil, the resin composition layer, and if necessary the resin coating, are measured. The thickness at 5 positions is measured for 1 view, and the average of those values is taken as the thickness of each layer.

In the present embodiment, the hydroxyalkyl cellulose, the carboxyalkyl cellulose, and the water-soluble resin (B) can be analyzed and identified by known analytical methods. For example, these substances may be analyzed and identified by, after performing pre-treatments such as fractionating a target component by chromatography and the like, a method such as $^1$H-NMR, $^{13}$C-NMR, elemental analysis, mass spectrometry, infrared absorption spectrum analysis, ultraviolet-visible-near-infrared absorption spectrum analysis, Raman spectroscopy, X-ray diffraction, and composite analytical methods thereof.

The drilling processing using the entry sheet for drilling according to the present embodiment is drilling processing performed on, for example, a printed wiring board material, more specifically a laminated board or a multi-layer board. In the case of performing drilling processing on a printed wiring board material such as a laminated board or a multi-layer board, the entry sheet according to the present embodiment is arranged on at least the topmost surface of one or a plurality of stackable laminated boards or multi-layer boards so that the metallic support foil side of the entry sheet is in contact with the printed wiring board material, and the drilling processing is performed from the upper surface (surface of the resin composition layer) of the entry sheet for drilling.

According to the present embodiment, by using the above-described entry sheet for drilling processing, hole position accuracy is excellent, drill bit breakage can be suppressed, and processing chips wrapping around the drill bit can be reduced. Consequently, drilling can be carried out that is high in quality and has excellent productivity. Among these, by employing the entry sheet according to the present embodiment, especially excellent hole position accuracy is obtained for high-density, narrow-pitch drilling processing.

Example 1

The present invention will now be specifically described with reference to the following examples and comparative examples. However, the following examples merely illustrate one embodiment of the present invention. The present invention is not limited to these examples. Further, in the present specification, in the results of examples and comparative examples, "polyethylene glycol" is abbreviated as "PEG", "polyethylene oxide" is abbreviated as "PEO", "hydroxyethyl cellulose" is abbreviated as "HEC", and "carboxymethyl cellulose" is abbreviated as "CMC", in some cases.

Table 1 shows the raw material details of the cellulose derivative (A) (hydroxyethyl cellulose and carboxymethyl cellulose), water-soluble resin (B), additive, solvent, resin coating, and metallic support foil used to produce the entry sheets for drilling of the examples and comparative examples. Further, Table 2 shows the details of the drill bit, laminated board, and the entry board that are used in the drilling processing of the examples and comparative examples.

TABLE 1

| Item | | Name or Condition | Trade Name |
|---|---|---|---|
| Cellulose Derivative (A) | (a-1) | Hydroxyethyl Cellulose | SP-200 |
| | (a-2) | Hydroxyethyl Cellulose | SANHECL |
| | (a-3) | Hydroxyethyl Cellulose | SP-400 |
| | (a-4) | Hydroxyethyl Cellulose | SP-500 |
| Water-Soluble Resin | (b) | Carboxymethyl Cellulose | Serogen 7A |
| | (c) | Polyethylene Oxide | ALTOP MG150 |
| | (d) | Polyether Water-Soluble Resin | MELPOL F-220 |
| | (e) | Polyethylene Oxide | ALKOX L6 |
| | (f) | Polyethylene Glycol | PEG4000S |
| | (g) | Polyethylene Glycol | PEG20000 |
| Additive | (h) | Sodium Formate | — |
| | (i) | Inositol | — |
| | (j) | Surface Control Agent | BYK-349 |
| | (k) | Surface Control Agent | BYK-014 |
| | (l) | Surface Control Agent | Nonion LT221 |
| Solvent | — | Deionized Water | — |
| | (m) | Methyl Alcohol | — |
| | (n) | Ethyl Alcohol | — |
| | (o) | Isopropyl Alcohol | — |
| Resin Coating | (p) | Thermosetting Resin (cyanate resin) | CA210 |
| | | Thermosetting Resin (epoxy resin) | JER1001 |
| | (q) | Polyester Resin | Vylonal MD1100 |
| Metallic support Foil | | Thickness 0.07 mm JIS Standard 1100 | High-Purity Aluminum Foil |

| Item | | Manufacturer | Weight Average Molecular Weight Mw | 2% Aqueous Solution Viscosity mPa·S | Average Substitution Degree DS | Average Number of Added Moles MS |
|---|---|---|---|---|---|---|
| Cellulose Derivative (A) | (a-1) | Daicel FineChem Ltd. | 120,000 | 15 | 1.3 | 2.2 |
| | (a-2) | Sansho Co., Ltd. | 150,000 | 15 | 1.5 | 2.5 |
| | (a-3) | Daicel FineChem Ltd. | 300,000 | 100 | 1.3 | 2.2 |
| | (a-4) | Daicel FineChem Ltd. | 500,000 | 350 | 1.3 | 2.2 |
| Water-Soluble Resin | (b) | Dai-Ichi Kogyo Seiyaku Co., Ltd. | 180,000 | 16 | 0.75 | — |
| | (c) | Meisei Chemical Works, Ltd. | 150,000 | — | — | — |
| | (d) | Sanyo Chemical Industries, Ltd. | 100,000 | — | — | — |
| | (e) | Meisei Chemical Works, Ltd. | 60,000 | — | — | — |
| | (f) | Sanyo Chemical Industries, Ltd. | 3,000 | — | — | — |
| | (g) | Sanyo Chemical Industries, Ltd. | 20,000 | — | — | — |
| Additive | (h) | Mitsubishi Gas Chemical Company, Inc. | — | — | — | — |
| | (i) | Wako Pure Chemical Industries, Ltd. | — | — | — | — |
| | (j) | BYK Japan KK | — | — | — | — |
| | (k) | BYK Japan KK | — | — | — | — |
| | (l) | NOF Corporation | — | — | — | — |
| Solvent | — | — | — | — | — | — |
| | (m) | Mitsubishi Gas Chemical Company, Inc. | — | — | — | — |
| | (n) | Wako Pure Chemical Industries, Ltd. | — | — | — | — |
| | (o) | Wako Pure Chemical Industries, Ltd. | — | — | — | — |
| Resin Coating | (p) | Mitsubishi Gas Chemical Company, Inc. | — | — | — | — |
| | | Mitsubishi Chemical Corporation | — | — | — | — |
| | (q) | Toyobo Co., Ltd. | — | — | — | — |
| Metallic support Foil | | Mitsubishi Aluminum Co., Ltd. | — | — | — | — |

TABLE 2

| Item | Conditions | Trade Name | Manufacturer | Note |
|---|---|---|---|---|
| Drill Bit | 0.105 mmφ | KMC L518A | Union Tool Co. | — |
| | 0.08 mmφ | KMW M251DWU | Union Tool Co. | Carbon coated. |
| | 0.105 mmφ | MV J676W | Union Tool Co. | — |
| | 0.05 mmφ | KMD J843 | Union Tool Co. | — |
| Laminated board | Thickness 0.1 mm Copper Foil (Thickness 3 μm) Double-Sided Board | HL832NS | Mitsubishi Gas Chemical Company, Inc. | — |
| | Thickness 0.1 mm Copper Foil (Thickness 3 μm) Double-Sided Board | HL832NXA | Mitsubishi Gas Chemical Company, Inc. | — |
| | Thickness 0.1 mm Copper Foil (Thickness 12 μm) Double-Sided Board | HL832NXA | Mitsubishi Gas Chemical Company, Inc. | — |

TABLE 2-continued

| Item | Conditions | Trade Name | Manufacturer | Note |
|---|---|---|---|---|
| Entry board | Thickness 1.5 mm | SPB-W | Nihon Decoluxe Co., Ltd. | — |
| | Thickness 1.5 mm | PS1160G | Risho Kogyo Co., Ltd. | — |

Example 1

10 parts by mass of hydroxyethyl cellulose (trade name: SANHECL, manufactured by Sansho Co., Ltd.) having a 2% aqueous solution viscosity of 15 mPa·s, a weight average molecular weight of 150,000, a DS of 1.5, and an MS of 2.5 and 90 parts by mass of polyethylene glycol (trade name: PEG4000S, manufactured by Sanyo Chemical Industries, Ltd.) having a weight average molecular weight of 3,000 were dissolved in a mixed solvent of water and methanol so that the resin solid e concentration in the solution was 20% by mass. The ratio of water and methanol (water/methanol) at this stage was adjusted at 80 parts by mass/20 parts by mass. Further, this resin solution was charged with 1 part by mass of surface control agent (trade name: BYK-349, manufactured by BYK Japan KK) based on 100 parts by mass of resin solid content, and then charged with a further 0.3 parts by mass of sodium formate (manufactured by Mitsubishi Gas Chemical Company, Inc.) based on 100 parts by mass of resin solid content, and the resultant mixture was uniformly dispersed. The resultant resin composition solution was filtered using a filter (trade name: CUNO Micro-Klean Filter Cartridge, manufactured by Sumitomo 3M Limited) having a filtering accuracy of 10 μm.

The filtered resin composition solution was applied using a bar coater on aluminum foil (JIS-A1100H18, thickness 0.07 mm, manufactured by Mitsubishi Aluminum Co., Ltd.) on which a 0.01 mm-thick epoxy resin coating was formed on one surface so that the thickness of the solidified resin composition layer would be 0.03 mm. The applied resin composition solution was dried for 3 minutes at 120° C. with a dryer, then cooled to solidify, thereby producing an entry sheet for drilling.

The obtained entry sheet for drilling was arranged on the upper surface of a stack of six 0.1 mm-thick laminated boards (trade name: HL832NS, copper foil thickness: 3 μm, double-sided board, manufactured by Mitsubishi Gas Chemical Company, Inc.) so that the aluminum foil side was contacting the laminated boards. On the lower surface of the laminated boards, a 1.5 mm-thick entry board (paper phenolic laminated board, trade name: SPB-W, manufactured by Nihon Decoluxe Co., Ltd.) was arranged. Next, drilling processing was performed using a 0.105 mmϕ drill bit (trade name: KMCL518A, manufactured by Union Tool Co.) under conditions (drilling conditions 1) of a rotation speed of 300,000 rpm, feed rate of 2.4 m/min, set drill bit life: 5,000 holes per drill bit, and number of drill bits used: 6, and the hole position accuracy was evaluated. The results are shown in Tables 7 and 8.

Next, the entry sheet for drilling was arranged on the upper surface of a stack of six 0.1 mm-thick laminated boards (trade name: HL832NXA, copper foil thickness: 3 μm, double-sided board, manufactured by Mitsubishi Gas Chemical Company, Inc.) so that the aluminum foil side was contacting the laminated boards. On the lower surface of the laminated boards, a 1.5 mm-thick entry board (paper phenolic laminated board, trade name: SPB-W, manufactured by Nihon Decoluxe Co., Ltd.) was arranged. Next, drilling processing was performed using a 0.08 mmϕ drill bit (trade name: KMWM251DWU, manufactured by Union Tool Co.) under conditions (drilling conditions 2) of a rotation speed of 300,000 rpm, feed rate of 2.4 m/min, set drill bit life: 10,000 holes per drill bit, and number of drill bits used: 3, and the presence of drill bit breakage was confirmed. Then, all of the used drill bits that were not broken were further evaluated regarding hole position accuracy and the state of processing chips wrapping around the drill bit. The results are shown in Tables 7 and 8.

In addition, the entry sheet for drilling was arranged on the upper surface of a stack of four 0.1 mm-thick laminated boards (trade name: HL832NXA, copper foil thickness: 12 μm, double-sided board, manufactured by Mitsubishi Gas Chemical Company, Inc.) so that the aluminum foil side was contacting the laminated boards. On the lower surface of the laminated boards, a 1.5 mm-thick entry board (paper phenolic laminated board, trade name: PS1160G, manufactured by Risho Kogyo Co., Ltd.) was arranged. Next, drilling processing was performed using a 0.105 mmϕ drill bit (trade name: MVJ676W, manufactured by Union Tool Co.) under conditions (drilling conditions 3) of a rotation speed of 200,000 rpm, feed rate of 2.0 m/min, set drill bit life: 5,000 holes per drill bit, and number of drill bits used: 6, and the number of drilling-processable holes was evaluated. The results are shown in Tables 7 and 8.

Further, the entry sheet for drilling was arranged on the upper surface of a 0.2 mm-thick laminated board (trade name: HL832NS, copper foil thickness: 3 μm, double-sided board, manufactured by Mitsubishi Gas Chemical Company, Inc.) so that the aluminum foil side was contacting the laminated board. On the lower surface of the laminated board, a 1.5 mm-thick entry board (paper phenolic laminated board, trade name: SPB-W, manufactured by Nihon Decoluxe Co., Ltd.) was arranged. Next, drilling processing was performed using a 0.05 mmϕ drill bit (trade name: KMDJ843, manufactured by Union Tool Co.) under conditions (drilling conditions 4) of a rotation speed of 300,000 rpm, feed rate of 1.5 m/min, set drill bit life: 200 holes per drill bit, and number of drill bits used: 3. Cases in which all 3 drill bits could form holes until the end were evaluated as "drilling-processable holes until the end were evaluated as "not drill-processable". The results are shown in Table 9.

Examples 2 to 34 and Comparative Examples 1 to 10

In Examples 2 to 34 and Comparative Examples 1 to 10, resin composition solutions were prepared, and filtered, with the types and contents of the respective materials shown in Tables 4, 5, and 6 based on Example 1. Next, the filtered resin composition solutions were coated on aluminum foil on which a 0.01 mm-thick resin coating was formed on one surface, dried, cooled, and solidified to produce an entry sheet for drilling, based on Example 1. Among these sheets, in Comparative Examples 3 to 10, an entry sheet for drilling was produced using a resin composition that did not include hydroxyethyl cellulose or carboxymethyl cellulose.

Next, using these entry sheets for drilling, based on Example 1, drilling processing was carried out, and hole position accuracy, drill bit breakage, the state of processing chips wrapping around the drill bit, and the number of drilling-processable holes were evaluated. The results are respectively shown in Tables 7 and 8. Further, regarding Examples 2 and 3 and Comparative Examples 3 and 4, drilling processing was performed based on drilling conditions 4, and whether the drilling processing was "processable" or "not processable" was evaluated. These results are shown in Table 9.

In addition, based on the evaluation results of hole position accuracy, drill bit breakage, the state of processing chips wrapping around the drill bit, and the number of drilling-processable holes, Examples 1 to 34 and Comparative Examples 1 to 10 were subjected to an overall evaluation based on the evaluation standards shown in Table 3. These results are respectively shown in Tables 4, 5, and 6. Here, the overall evaluation reflects the lowest evaluation result among excellent, good, fair, and poor determined from each evaluation item.

TABLE 3

| Determination Standard Overall Evaluation | | Drilling Conditions 1 Hole Position Accuracy (μm) | Drilling Conditions 2 | | | Drilling Conditions 3 Number of Drilling-processable Holes (holes) |
|---|---|---|---|---|---|---|
| | | | Hole Position Accuracy (μm) | Drill Bit Breakage (presence) | Processing chips Wrapping (presence) | |
| ★★★★ Excellent | Example | 18 less than | 22 less than | No | No | 3,000 or more |
| ★★★ Good | Example | 20 less than | 24 less than | No | No | 2,000 or more 3,000 less than |
| ★★ Fair | Example | 22 less than | 26 less than | No | No | 1,000 or more 2,000 less than |
| ★ Poor | Comparative Example | 22 or more | 26 or more | Yes | Yes | 1,000 less than |

<Evaluation Methods>
1) Weight Average Molecular Weight

The weight average molecular weights of the cellulose derivative (A) and the water-soluble resin (B) were calculated as a relative average molecular weight by liquid chromatography using a GPC column (manufactured by Shimadzu Corporation). The used equipment and the analysis conditions were as follows.
[Used Equipment]
High-performance liquid chromatograph manufactured by Shimadzu Corporation, Trade name: Prominence LIQUID CHROMATOGRAPH System
System controller: CBM-20A
Feed unit: LC-20AD
Online degasser: DGU-20A3
Autosampler: SIL-20AHT
Column oven: CTO-20A
Differential refractive index detector: RID-10A
LC workstation: LCsolution
[Analytical Conditions]
Column: Trade name "TSK-GEL G3000PW", filler particle size: 12 μm, internal diameter 7.5 mm×length 300 mm×two columns, trade name "TSK-GEL GMPW", filler particle size: 17 μm, internal diameter 7.5 mm×length 300 mm×two columns, above all manufactured by Tosoh Corporation
Guard column: Trade name "TSK GUARD COLUMN PWH", internal diameter 7.5 mm×length 75 mm, manufactured by Tosoh Corporation
Eluent: 50 mmol/L aqueous sodium chloride solution (sodium chloride: manufactured by Wako Pure Chemical Industries, Ltd., reagent grade, water: deionized water)
Flow rate: 1.00 ml/min
Column temperature: 45.0° C.
Polyethylene glycol for producing calibration curve: Polyethylene Glycol, trade name "Calibration Kit PEG-10", manufactured by Varian Polyethylene oxide for producing calibration curve: Trade name "TSK standard Poly(ethylene oxide)", manufactured by Tosoh Corporation, weight average molecular weight: 106, 615, 1970, 3930, 7920, 21030, 43000, 101000, 185000, and 580000 polyethylene glycol and polyethylene oxide
2) Aqueous Solution Viscosity The 2% aqueous solution viscosity was measured based on JIS K7117 (1999) for 60 seconds under a condition of 25° C. using a B II type viscometer (BL II) manufactured by Toki Sangyo Co., Ltd.
3) Average Number of Added Moles (MS)

The MS of the hydroxyethyl cellulose was measured based on ASTM D2364 (2007) (Morgan method).

4) Average Substitution Degree (DS)

The DS of the hydroxyethyl cellulose was calculated by measuring the $^{13}$C-NMR spectrum based on the MS value obtained by the Morgan method. Further, the DS of the carboxymethyl cellulose was calculated by measuring the $^{1}$H-NMR spectrum.
5) Hole Position Accuracy The hole position accuracy of the entry sheets for drilling was calculated as follows. First, deviation between a hole position and a designated coordinate on the under surface (lower surface) of the bottommost board of stacked laminated boards was measured with a hole analyzer (trade name: HA-1AM, manufactured by Hitachi Via Mechanics, Ltd.). This deviation was calculated as the mean+3σ by calculating the mean and the standard deviation (a) of each drill bit. Then, the mean value of each "mean+3σ" was calculated for n-number of used drill bits and taken as the hole position accuracy of the overall drilling processing. The used formula was as follows.

$$\text{Hole Position Accuracy } (\mu m) \text{ of the overall drilling} = \left( \sum_{j=1}^{n} \text{"mean} + 3\sigma\text{"}_i \text{ of drill bit} \right) \div n \quad \text{[Equation 1]}$$

6) Drill Bit Breakage

Whether a drill bit had broken was visually confirmed by observing the drill bits after drilling processing.
7) Number of Drilling-Processable Holes The number of through holes on the under surface (lower surface) of the bottommost board of stacked laminated boards was counted with a hole analyzer (trade name: HA-1AM, manufactured by Hitachi Via Mechanics, Ltd.). The average value per used drill bit (i.e., the number of through holes per drill bit) was calculated, and this value was taken as the number of drilling-processable holes.

8) Evaluation of Processing Chips Wrapping Around the Drill Bit

All of the drill bits recovered after the drilling processing were observed with the microscope (magnifications: 100), and the maximum size in the drill bit radial direction of the portions where processing chips had wrapped around the drill bit (hereinafter referred to as "maximum diameter of processing chips wrapping") was determined drilling processing. Cases in which the maximum diameter of processing chips wrapping was less than 1.5 times the drill bit diameter were evaluated as "no", and cases in which the maximum diameter of processing chips wrapping was 1.5 times or more the drill bit diameter were evaluated as "yes".

9) Resin Protrusion Height Around Drilling Processed Hole Periphery

The resin protrusion height around the drilling processed hole periphery was calculated from height information in data obtained using a laser microscope (trade name: VK-9700, manufactured by Keyence Corporation) that captured an image of the resin composition layer surface that included drilling processed holes for the upper surface of an entry sheet for drilling that had been subjected to drilling processing under drilling conditions 2. The "resin protrusion height around the drilling processed hole periphery" indicates, for a range up to a distance of less than 50% of the drill bit diameter beyond the outer circumference of the hole, the difference between the highest portion of the resin protrusion and the average height of a portion not subjected to drilling processing (a flat portion) beyond this range, for the holes drilled into an entry sheet for drilling that had been subjected to drilling (hereinafter also referred to simply as "resin protrusion height"). FIG. 1 is a series of photographs capturing the resin composition layer surface including a drilling processed hole for illustrating the "resin protrusion height around a drilling processed hole periphery" for the upper surface of an entry sheet for drilling after drilling processing according to the examples and comparative examples. Reference symbol A indicates a drilling processed hole, reference symbol B indicates the range up to a distance of less than 50% of the drill bit diameter, and reference symbol C indicates a portion not subjected to drilling processing. Evaluation was carried out by taking the positive value when the highest resin protrusion portion in the range up to a distance of less than 50% of the drill bit diameter based on the average height of the portion not subjected to drilling processing of the resin composition layer surface was a convexity on the upper side, and the negative value when this portion was a concavity. Here, the resin protrusion height is indicated as an average value taken from data obtained by repeated obtaining data for 10 drilling processed holes.

TABLE 4

| | Cellulose Derivative (A) | | Water-Soluble Resin (B) | | | | Additive | |
|---|---|---|---|---|---|---|---|---|
| | Type | Content Parts by Mass | Type | Content Parts by Mass | Type | Content Parts by Mass | Type | Content Parts by Mass |
| Example 1 | a-2 | 10 | f | 90 | — | — | h | 0 |
| Example 2 | a-2 | 20 | f | 80 | — | — | h | 0 |
| Example 3 | a-2 | 20 | c | 20 | f | 60 | h | 0 |
| Example 4 | a-2 | 30 | f | 70 | — | — | h | 0 |
| Example 5 | a-2 | 30 | c | 10 | f | 60 | h | 0 |
| Example 6 | a-2 | 30 | c | 10 | f | 60 | h | 0 |
| Example 7 | a-2 | 30 | d | 10 | f | 60 | h | 0 |
| Example 8 | a-2 | 40 | f | 60 | — | — | h | 0 |
| Example 9 | a-1 | 30 | c | 10 | f | 60 | h | 0 |
| Example 10 | a-3 | 30 | c | 10 | f | 60 | h | 0 |
| Example 11 | a-2 | 10 | c | 10 | g | 80 | h | 0 |
| Example 12 | b | 10 | c | 10 | g | 80 | h | 0 |
| Example 13 | a-2 | 5 | f | 95 | — | — | h | 0 |
| Example 14 | a-2 | 20 | f | 80 | — | — | h | 0 |
| Example 15 | a-2 | 20 | g | 80 | — | — | h | 0 |
| Example 16 | a-2 | 20 | c | 24 | f | 56 | h | 0 |
| Example 17 | a-2 | 20 | c | 24 | g | 56 | h | 0 |

| | Surface Control Agent | | | | Solvent | | Resin Composition | |
|---|---|---|---|---|---|---|---|---|
| | Type | Content Parts by Mass | Type | Content Parts by Mass | Type | Ratio[1] | Resin Coating | Layer Thickness μm | Resin Solid Concentration % |
| Example 1 | j | 1 | — | — | m | 80:20:0:0 | p | 30 | 20 |
| Example 2 | j | 1 | — | — | m | 80:20:0:0 | p | 30 | 20 |
| Example 3 | j | 1 | — | — | m | 80:20:0:0 | p | 30 | 20 |
| Example 4 | j | 1 | — | — | m | 80:20:0:0 | p | 30 | 20 |
| Example 5 | j | 1 | — | — | m | 80:20:0:0 | p | 30 | 20 |
| Example 6 | j | 1 | — | — | m | 80:20:0:0 | q | 30 | 20 |
| Example 7 | j | 1 | — | — | m | 80:20:0:0 | p | 30 | 20 |
| Example 8 | j | 1 | — | — | m | 80:20:0:0 | p | 30 | 20 |
| Example 9 | j | 1 | — | — | m | 80:20:0:0 | p | 30 | 20 |
| Example 10 | j | 1 | — | — | m | 80:20:0:0 | p | 30 | 20 |
| Example 11 | j | 1 | — | — | m | 80:20:0:0 | p | 30 | 20 |
| Example 12 | j | 1 | — | — | m | 80:20:0:0 | p | 30 | 20 |
| Example 13 | j | 1 | — | — | m | 80:20:0:0 | p | 30 | 20 |

TABLE 4-continued

| | | | | | | | | | |
|---|---|---|---|---|---|---|---|---|---|
| Example 14 | j | 1 | — | — | m | 80:20:0:0 | p | 30 | 20 |
| Example 15 | j | 1 | — | — | m | 80:20:0:0 | p | 30 | 20 |
| Example 16 | j | 1 | — | — | m | 80:20:0:0 | p | 30 | 20 |
| Example 17 | j | 1 | — | — | m | 80:20:0:0 | p | 30 | 20 |

[1] Water:Methanol:Ethanol:Isopropanol Mass Ratio

TABLE 5

| | Cellulose Derivative (A) | | Water-Soluble Resin (B) | | | | Additive | |
|---|---|---|---|---|---|---|---|---|
| | Type | Content Parts by Mass | Type | Content Parts by Mass | Type | Content Parts by Mass | Type | Content Parts by Mass |
| Example 18 | a-2 | 20 | c | 32 | f | 48 | h | 0 |
| Example 19 | a-2 | 20 | e | 32 | g | 48 | h | 0 |
| Example 20 | a-2 | 20 | c | 10 | f | 48 | h | 0 |
| Example 21 | a-2 | 20 | c | 10 | g | 48 | h | 0 |
| Example 22 | a-2 | 30 | c | 10 | f | 60 | h | 0 |
| Example 23 | a-2 | 30 | c | 10 | f | 60 | h | 0 |
| Example 24 | a-2 | 30 | c | 10 | f | 60 | h | 0 |
| Example 25 | a-2 | 30 | c | 10 | f | 60 | h | 0 |
| Example 26 | a-2 | 30 | c | 10 | f | 60 | h | 0 |
| Example 27 | a-2 | 30 | c | 10 | f | 60 | h | 0 |
| Example 28 | a-2 | 30 | c | 10 | f | 60 | h | 0 |
| Example 29 | a-2 | 30 | c | 10 | f | 60 | h | 0 |
| Example 30 | a-2 | 30 | c | 10 | f | 60 | — | — |
| Example 31 | a-2 | 30 | c | 10 | f | 60 | i | 0 |
| Example 32 | a-2 | 30 | c | 10 | f | 60 | h | 0 |
| Example 33 | a-2 | 30 | c | 10 | f | 60 | h | 0 |
| Example 34 | a-2 | 30 | c | 10 | f | 60 | h | 0 |

| | Surface Control Agent | | | | Solvent | | | Resin Composition | |
|---|---|---|---|---|---|---|---|---|---|
| | Type | Content Parts by Mass | Type | Content Parts by Mass | Type | Ratio[1] | Resin Coating | Layer Thickness μm | Resin Solid Concentration % |
| Example 18 | j | 1 | — | — | m | 80:20:0:0 | p | 30 | 20 |
| Example 19 | j | 1 | — | — | m | 80:20:0:0 | p | 30 | 20 |
| Example 20 | j | 1 | — | — | m | 80:20:0:0 | p | 30 | 12 |
| Example 21 | j | 1 | — | — | m | 80:20:0:0 | p | 30 | 21 |
| Example 22 | j | 1 | — | — | m | 80:20:0:0 | p | 30 | 30 |
| Example 23 | j | 1 | — | — | n | 80:0:20:0 | p | 30 | 20 |
| Example 24 | j | 1 | — | — | o | 80:0:0:20 | p | 30 | 20 |
| Example 25 | j | 1 | — | — | m/n | 80:10:10:0 | p | 30 | 20 |
| Example 26 | j | 1 | — | — | m/o | 80:10:0:10 | p | 30 | 20 |
| Example 27 | j | 1 | — | — | n/o | 80:10:0:10 | p | 30 | 20 |
| Example 28 | j | 1 | — | — | — | 100:0:0:0 | p | 30 | 20 |
| Example 29 | j | 1 | — | — | m | 60:40:0:0 | p | 40 | 20 |
| Example 30 | j | 1 | — | — | m | 80:20:0:0 | q | 30 | 20 |
| Example 31 | j | 1 | — | — | m | 80:20:0:0 | q | 30 | 20 |
| Example 32 | — | — | — | — | m | 80:20:0:0 | q | 30 | 20 |
| Example 33 | j | 1 | 1 | 3 | m | 80:20:0:0 | q | 30 | 20 |
| Example 34 | j | 1 | k | 1 | m | 80:20:0:0 | q | 30 | 20 |

[1] Water:Methanol:Ethanol:Isopropanol Mass Ratio

TABLE 6

| | Cellulose Derivative (A) | | Water-Soluble Resin (B) | | | | Additive | |
|---|---|---|---|---|---|---|---|---|
| | Type | Content Parts by Mass | Type | Content Parts by Mass | Type | Content Parts by Mass | Type | Content Parts by Mass |
| Comparative Example 1 | a-2 | 50 | f | 50 | — | — | h | 0 |

TABLE 6-continued

| | | | | | | | | |
|---|---|---|---|---|---|---|---|---|
| Comparative Example 2 | a-4 | 30 | f | 70 | — | — | h | 0 |
| Comparative Example 3 | — | — | f | 100 | — | — | h | 0 |
| Comparative Example 4 | — | — | g | 100 | — | — | h | 0 |
| Comparative Example 5 | — | — | c | 100 | — | — | h | 0 |
| Comparative Example 6 | — | — | d | 100 | — | — | h | 0 |
| Comparative Example 7 | — | — | c | 10 | g | 80 | h | 0 |
| Comparative Example 8 | — | — | c | 20 | f | 60 | h | 0 |
| Comparative Example 9 | — | — | d | 10 | f | 60 | h | 0 |
| Comparative Example 10 | — | — | c | 10 | f | 60 | h | 0 |

| | Surface Control Agent | | | | Solvent | | Resin Coating | Resin Composition Layer Thickness μm | Resin Solid Concentration % |
|---|---|---|---|---|---|---|---|---|---|
| | Type — | Content Parts by Mass | Type — | Content Parts by Mass | Type — | Ratio[1] — | | | |
| Comparative Example 1 | j | 1 | — | — | m | 80:20:0:0 | p | 30 | 20 |
| Comparative Example 2 | j | 1 | — | — | m | 80:20:0:0 | p | 30 | 20 |
| Comparative Example 3 | j | 1 | — | — | m | 80:20:0:0 | p | 30 | 20 |
| Comparative Example 4 | j | 1 | — | — | m | 80:20:0:0 | p | 30 | 20 |
| Comparative Example 5 | j | 1 | — | — | m | 80:20:0:0 | p | 30 | 20 |
| Comparative Example 6 | j | 1 | — | — | m | 80:20:0:0 | p | 30 | 20 |
| Comparative Example 7 | j | 1 | — | — | m | 80:20:0:0 | p | 30 | 20 |
| Comparative Example 8 | j | 1 | — | — | m | 80:20:0:0 | p | 30 | 20 |
| Comparative Example 9 | j | 1 | — | — | m | 80:20:0:0 | p | 30 | 20 |
| Comparative Example 10 | j | 1 | — | — | m | 80:20:0:0 | p | 30 | 20 |

[1] Water:Methanol:Ethanol:Isopropanol Mass Ratio

TABLE 7

| | Drilling Conditions 1 | Drilling Conditions 2 | | | Drilling Conditions 3 | | |
|---|---|---|---|---|---|---|---|
| | Hole Position Accuracy μm | Hole Position Accuracy μm | Drill Bit Breakage | Wrapping | Number of Drilling Processed Holes Number | Overall | Resin Protrusion Height μm |
| Example 1 | 15.6 | 17.3 | No | No | 4222 | ★★★★ | — |
| Example 2 | 17.1 | 18.6 | No | No | 3361 | ★★★★ | — |
| Example 3 | 18.3 | 19.6 | No | No | 1845 | ★★ | — |
| Example 4 | 15.1 | 21.5 | No | No | 3233 | ★★★★ | — |
| Example 5 | 14.5 | 16.2 | No | No | 1321 | ★★ | 1.7 |
| Example 6 | 14.8 | 13.8 | No | No | 4420 | ★★★★ | 1 |
| Example 7 | 15.1 | 13.0 | No | No | 3118 | ★★★★ | 2.2 |
| Example 8 | 18.3 | 19.3 | No | No | 2829 | ★★★ | — |
| Example 9 | 14.9 | 19.0 | No | No | 2996 | ★★★ | — |
| Example 10 | 15.9 | 18.8 | No | No | 1017 | ★★ | — |
| Example 11 | 16.9 | 17.8 | No | No | 3529 | ★★★★ | — |
| Example 12 | 18.4 | 18.9 | No | No | 3394 | ★★★ | — |
| Example 13 | 15.9 | 22.9 | No | No | 2314 | ★★★ | — |
| Example 14 | 17.1 | 18.6 | No | No | 4019 | ★★★★ | — |
| Example 15 | 21.7 | 18.0 | No | No | 3606 | ★★ | — |
| Example 16 | 17.1 | 19.5 | No | No | 4458 | ★★★★ | — |

TABLE 7-continued

| | Drilling Conditions 1 | Drilling Conditions 2 | | | Drilling Conditions 3 | | |
|---|---|---|---|---|---|---|---|
| | Hole Position Accuracy μm | Hole Position Accuracy μm | Drill Bit Breakage | Wrapping | Drilling Processed Holes Number | Overall | Resin Protrusion Height μm |
| Example 17 | 14.8 | 23.9 | No | No | 2071 | ★★★ | — |
| Example 18 | 15.9 | 15.8 | No | No | 4001 | ★★★★ | — |
| Example 19 | 14.7 | 19.8 | No | No | 3206 | ★★★★ | — |
| Example 20 | 14.9 | 20.9 | No | No | 2116 | ★★★ | — |
| Example 21 | 13.2 | 17.0 | No | No | 2375 | ★★★ | — |
| Example 22 | 13.6 | 16.3 | No | No | 2250 | ★★★ | — |

TABLE 8

| | Drilling Conditions 1 | Drilling Conditions 2 | | | Drilling Conditions 3 | | |
|---|---|---|---|---|---|---|---|
| | Hole Position Accuracy μm | Hole Position Accuracy μm | Drill Bit Breakage | Wrapping | Drilling Processed Holes Number | Overall | Resin Protrusion Height μm |
| Example 23 | 16.5 | 19.1 | No | No | 1166 | ★★ | — |
| Example 24 | 15.0 | 21.3 | No | No | 2817 | ★★★ | — |
| Example 25 | 14.9 | 18.4 | No | No | 4276 | ★★★★ | — |
| Example 26 | 16.4 | 18.3 | No | No | 3317 | ★★★★ | — |
| Example 27 | 16.3 | 24.3 | No | No | 3877 | ★★ | — |
| Example 28 | 14.9 | 25.0 | No | No | 2432 | ★★ | — |
| Example 29 | 18.6 | 24.8 | No | No | 3878 | ★★ | — |
| Example 30 | 14.0 | 17.9 | No | No | 2062 | ★★★ | — |
| Example 31 | 15.4 | 17.7 | No | No | 2347 | ★★★ | — |
| Example 32 | 15.3 | 18.0 | No | No | 1770 | ★★ | — |
| Example 33 | 13.3 | 16.2 | No | No | 2308 | ★★★ | — |
| Example 34 | 12.8 | 21.4 | No | No | 1910 | ★★ | — |
| Comparative Example 1 | 17.5 | — | Yes | — | 500 | ★ | — |
| Comparative Example 2 | 25.5 | — | Yes | — | 704 | ★ | — |
| Comparative Example 3 | Flat sheet was not obtained. | | | | | ★★★ | — |
| Comparative Example 4 | Flat sheet was not obtained. | | | | | ★★★★ | — |
| Comparative Example 5 | 23.6 | — | Yes | — | 4562 | ★ | — |
| Comparative Example 6 | 21.5 | — | Yes | — | 4600 | ★ | — |
| Comparative Example 7 | 18.7 | 24.1 | No | Yes | 1776 | ★ | 5.4 |
| Comparative Example 8 | 19.8 | — | Yes | — | 3245 | ★ | — |
| Comparative Example 9 | 24.5 | 37.5 | Yes | — | 2931 | ★ | — |
| Comparative Example 10 | 31.6 | — | Yes | — | 2941 | ★ | — |

TABLE 9

| | Cellulose Derivative (A) | | Water-Soluble Resin (B) | | | | Additive | | Surface Control Agent | | |
|---|---|---|---|---|---|---|---|---|---|---|---|
| | Type | Content Parts by Mass | Type | Content Parts by Mass | Type | Content Parts by Mass | Type | Content Parts by Mass | Type | Content Parts by Mass | Drilling Conditions 4 |
| Example 1 | a-2 | 10 | f | 90 | — | — | h | 0.3 | j | 1 | Drillable |
| Example 2 | a-2 | 20 | f | 80 | — | — | h | 0.3 | j | 1 | Drillable |
| Example 3 | a-2 | 20 | c | 20 | f | 60 | h | 0.3 | j | 1 | Drillable |
| Comparative Example 3 | — | — | f | 100 | — | — | h | 0.3 | j | 1 | Undrillable |
| Comparative Example 4 | — | — | g | 100 | — | — | h | 0.3 | j | 1 | Undrillable |

From a comparison between Example 4 and Comparative Example 2 shown in Tables 7 and 8, it has been found that if the weight average molecular weight of the hydroxyethyl cellulose exceeds 350,000, in drilling conditions 2, processing chips wrapping around the drill bit increases, and drill bit breakage occurs.

From the results of Comparative Examples 3 and 4 shown in Table 8, it was learned that if neither hydroxyethyl cellulose nor carboxymethyl cellulose is included and the weight average molecular weight of the water-soluble resin (B) is small, sheet forming properties deteriorate. In contrast, from a comparison of Comparative Examples 7, 8, 9, and 10, in which sheet forming properties were improved, and Examples 11, 12, 3, 5, 6, 7, 9, and 10, in which the resin composition was changed so as to include hydroxyethyl cellulose or carboxymethyl cellulose, it was learned that due to the inclusion of the hydroxyethyl cellulose or carboxymethyl cellulose, drill bit biting properties improve and hole position accuracy also improves. In addition, it was also learned that there is an effect for reducing processing chips wrapping around the drill bit and suppressing drill bit breakage.

From the results of Examples 8 and 13 shown in Table 7, it was learned that if the hydroxyethyl cellulose content is within a range of 5 to 40 parts by mass based on 100 parts by mass of the resin composition, hole position accuracy, a reduction in processing chips wrapping around the drill bit, and an improvement in resistance to drill bit breakage are obtained.

From the results of Examples 5 and 22 shown in Table 7, it was learned that even if the resin solid concentration is different, a good sheet surface is obtained, and there is the same level of hole position accuracy, resistance to drill bit breakage, and reduction effect in processing chips wrapping around the drill bit.

From the results of Examples 22 to 28 of Tables 7 and 8, it was learned that regardless of whether the solvent dissolving the resin composition is only water or is a mixed solvent of water and alcohol, a good sheet surface is obtained, and there is the same level of hole position accuracy, resistance to drill bit breakage, and reduction effect in processing chips wrapping around the drill bit.

From the results of Examples 6, 30, and 31 of Tables 7 and 8, it was learned that even if various additives are blended to the resin composition, a good sheet surface is obtained, and there is the same level of hole position accuracy, resistance to drill bit breakage, and reduction effect in processing chips wrapping around the drill bit.

From the results of Examples 33 and 34 of Tables 7 and 8, it was learned that by blending a surface control agent to the resin composition, an even better sheet surface is obtained, and an improvement in hole position accuracy is obtained.

In addition, conventionally, when there are resin protrusions around the periphery of drilling processed holes, if the drilling processing is performed at positions where the holes are close to each other (i.e., a narrow pitch), the hole position accuracy tends to deteriorate. Accordingly, to compare Examples 5, 6, and 7, which had especially good hole position accuracy, and Comparative Example 7, drilling processing was carried out under drilling conditions 2, and the resin protrusion height around the periphery of the drilling processed holes was then evaluated for the entry sheet for drilling. These results are shown in Tables 7 and 8. The resin protrusion height around the periphery of the drilling processed hole was 5.36 μm in Comparative Example 7, but about 1 to 2 μm in Examples 5, 6, and 7, which are good results. The present inventors believe the reason for this difference is as follows. However, the reasons may not be limited to these.

In a conventional entry sheet for drilling, resin protrusions are produced because the resin composition around the periphery of the drilling processed holes melts due to the friction heat and the like during drilling processing, and the resin of the resin composition resolidifying during the process of cooling to ordinary temperature while still protruding when the drill bit rotation is stopped. On the other hand, in the present invention, since hydroxyethyl cellulose and/or carboxymethyl cellulose that do not have a clear melting point are used, elasticity is maintained even when acted upon by the heat of friction and the like, so that thermal deformation of the resin composition is suppressed, and a flat surface state can be maintained. Further, since elasticity is maintained even when acted upon by the heat of friction and the like, centrality improves. Moreover, since the blended water-soluble resin melts, very high lubricating properties can be obtained. Based on the above, it is thought the hole position accuracy is improved in the narrow pitch drilling under drilling conditions 2.

Recently, with the increased density of printed wiring boards, the distance between the through holes formed on the board has become narrower, and the diameter of the used drill bits has become finer. Consequently, it has become much more difficult than previously to perform the drilling processing of a printed wiring board with a high hole position accuracy. To resolve this difficulty, slightly better hole position accuracy is obtained by means such as reducing the stacked number of boards during drilling processing, and curbing the number of holes that are drilled per drill bit. Consequently, the absolute value of the required hole position accuracy is decreased, so that even if that variation of accuracy has just a few microns, this can be determined as a clear difference. Therefore, in recent entry sheets for drilling, in view of the increasing density of printed wiring boards and smaller drill bit diameters, an improvement in a few microns in hole position accuracy can be said to be remarkable.

The present application claims priority from Japanese Patent Application No. 2012-63548 filed on Mar. 21, 2012, whose contents are herein incorporated by reference.

Compared with a conventional entry sheet for drilling, according to the present invention, an entry sheet for drilling that has better hole position accuracy, can suppress drill bit breakage, and exhibits less processing chips wrapping around the drill bit, and a method for drilling using this entry sheet for drilling, can be provided.

REFERENCE SIGNS LIST

A Drilling processed hole
B Range up to a distance of less than 50% of the drill bit diameter
C Portion not subjected to drilling processing

The invention claimed is:

1. An entry sheet for drilling comprising a metallic support foil and a layer comprising a resin composition that is formed on at least one surface of the metallic support foil, wherein
the resin composition comprises a cellulose derivative (A) and a water-soluble resin (B),
the cellulose derivative (A) comprises a hydroxyalkyl cellulose and/or a carboxyalkyl cellulose having a weight average molecular weight of 20,000 to 350,000, and
the content of the cellulose derivative (A) is 5 to 40 parts by mass and the content of the water-soluble resin (B) is 60 to 95 parts by mass based on 100 parts by mass of the resin composition,
wherein the cellulose derivative (A) comprises hydroxyalkyl cellulose.

2. The entry sheet for drilling according to claim 1, wherein the cellulose derivative (A) has a viscosity at 25° C. of a 2% by mass aqueous solution of 2 mPa·s or more to 300 mPa·s or less.

3. The entry sheet for drilling according to claim 1, wherein the cellulose derivative (A) has an average substitution degree of 0.5 to 3.0.

4. The entry sheet for drilling according to claim 1, wherein the water-soluble resin (B) comprises one or more resins selected from the group consisting of polyalkylene oxides, polyalkylene glycols, polyalkylene glycol derivatives, water-soluble acrylic resins, water-soluble polyester resins, and water-soluble urethane resins.

5. The entry sheet for drilling according to claim 1, wherein the water-soluble resin (B) has a weight average molecular weight of 3,000 to 150,000.

6. The entry sheet for drilling according to claim 1, wherein the water-soluble resin (B) comprises a water-soluble resin (B-1) having a weight average molecular weight of more than 10,000 and a water-soluble resin (B-2) having a weight average molecular weight of 10,000 or less.

7. The entry sheet for drilling according to claim 6, wherein the water-soluble resin (B) comprises 5 to 50 parts by mass of the water-soluble resin (B-1) and 50 to 95 parts by mass of the water-soluble resin (B-2) based on 100 parts by mass of the water-soluble resin (B).

8. The entry sheet for drilling according to claim 1, wherein the layer comprising a resin composition is formed by applying a solution containing the resin composition and water or a mixed solvent comprising water and alcohol on the at least one surface of the metallic support foil, drying, and solidifying.

9. The entry sheet for drilling according to claim 1, wherein the layer comprising a resin composition has a thickness of 0.005 to 0.3 mm.

10. The entry sheet for drilling according to claim 1, further comprising a resin coating between the metallic support foil and the layer comprising a resin composition.

11. The entry sheet for drilling according to claim 10, wherein the resin contained in the resin coating comprises one or more resins selected from the group consisting of cyanate resins, epoxy resins, and polyester resins.

12. The entry sheet for drilling according to claim 10, wherein the resin coating has a thickness of 0.001 to 0.02 mm.

13. The entry sheet for drilling according to claim 1, wherein the metallic support foil has a thickness of 0.05 to 0.5 mm.

14. The entry sheet for drilling according to claim 1, wherein the metallic support foil is an aluminum foil having an aluminum purity of 95% or more.

15. The entry sheet for drilling according to claim 1, which is used for drilling processing of a laminated board or a multi-layer board.

16. The entry sheet for drilling according to claim 15, which is used in hole boring processing by a drill bit having a diameter of 0.05 to 0.11 mmϕ.

17. A method for drilling, comprising placing the entry sheet for drilling according to claim 1 on a top surface of a laminated board or a multi-layer board, and drilling a hole in the laminated board or the multi-layer board from an upper surface of the entry sheet for drilling.

* * * * *